United States Patent
Goh et al.

(10) Patent No.: US 11,631,470 B2
(45) Date of Patent: Apr. 18, 2023

(54) SEMICONDUCTOR CHIP, METHOD OF FABRICATING THEREOF, AND METHOD OF TESTING A PLURALITY OF SEMICONDUCTOR CHIPS

(71) Applicant: GLOBALFOUNDRIES Singapore Pte. Ltd., Singapore (SG)

(72) Inventors: Szu Huat Goh, Singapore (SG); Shaalini Sivaramakrishnan, Singapore (SG); Li Song, Singapore (SG); Wei Fong Soh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/389,397

(22) Filed: Jul. 30, 2021

(65) Prior Publication Data
US 2023/0030630 A1    Feb. 2, 2023

(51) Int. Cl.
*G11C 29/12*      (2006.01)
*G11C 5/14*       (2006.01)
(Continued)

(52) U.S. Cl.
CPC .......... *G11C 29/12005* (2013.01); *G11C 5/14* (2013.01); *G11C 11/4125* (2013.01);
(Continued)

(58) Field of Classification Search
CPC ........ G11C 29/12005; G11C 29/50004; G11C 11/4125; G11C 2029/1202; G11C 5/14
(Continued)

(56) References Cited

U.S. PATENT DOCUMENTS

| | | | | |
|---|---|---|---|---|
| 7,679,394 B2* | 3/2010 | Aoki | .................. | G01R 31/3004 |
| | | | | 324/750.14 |
| 9,257,199 B2* | 2/2016 | Schreiber | ............. | G11C 29/025 |
| | | (Continued) | | |

FOREIGN PATENT DOCUMENTS

CN            103675636 A      3/2014

OTHER PUBLICATIONS

Welter et al., "Accurate Multiplexed Test Structure for Threshold Voltage Matching Evaluation", 2014 9th IEEE International Conference on Design & Technology of Integrated Systems in Nanoscale Era (DTIS), 2014, 6 pages, IEEE.
(Continued)

*Primary Examiner* — Son L Mai
(74) *Attorney, Agent, or Firm* — Viering Jentschura & Partner mbB (57) ABSTRACT

A semiconductor chip may include a memory, a power supply line, a noise generator and a switch. The power supply line may include first and second power supply line portions. The power supply line may be configured to provide a power supply signal through each of the first power supply line portion and the second power supply line portion. The noise generator may be connected to the second power supply line portion. The noise generator may be configured to receive the power supply signal from the second power supply line portion, and output a noisy power supply signal based on the power supply signal. The switch may be coupled to the memory, the first power supply line portion, and the noise generator. The switch may be configured to selectively electrically connect the memory to one of the first power supply line portion and the noise generator.

20 Claims, 6 Drawing Sheets

(51) Int. Cl.
*G11C 11/412* (2006.01)
*G11C 29/50* (2006.01)

(52) U.S. Cl.
CPC .............. *G11C 29/50004* (2013.01); *G11C 2029/1202* (2013.01)

(58) Field of Classification Search
USPC ........................................... 365/201
See application file for complete search history.

(56) References Cited

U.S. PATENT DOCUMENTS

2004/0113682 A1   6/2004   Hoon et al.
2007/0297254 A1   12/2007  Rosal et al.

OTHER PUBLICATIONS

Mahfuzul et al., "Variation-sensitive Monitor Circuits for Estimation of Die-to-Die Process Variation", 2011 IEEE Conference on Microelectronic Test Structures, 2011, pp. 153-157, IEEE.

Yang et al., "Identification of a Dopant Diffuse induced Threshold Voltage Shift Failure Mechanism in a SRAM Device via Nanoprobe Simulation and Wet Stain Techniques", Conference Proceedings from the 40th International Symposium for Testing and Failure Analysis, 2014, pp. 189-192, ASM International.

\* cited by examiner

SEMICONDUCTOR CHIP, METHOD OF FABRICATING THEREOF, AND METHOD OF TESTING A PLURALITY OF SEMICONDUCTOR CHIPS

TECHNICAL FIELD

Various embodiments relate to semiconductor chips, methods of fabricating a semiconductor chip, and method of testing a plurality of semiconductor chips. In particular, the semiconductor chip may have self-testing capability.

BACKGROUND

During the process of fabricating a semiconductor device, the integrated circuits of the chips on the wafer are typically tested for functional defects before the wafer is sent for die preparation. It is challenging to include testing devices onto the semiconductor wafer, owing to the high density of chips on the wafer. One example of the testing device is a scribe-line device that is typically placed between chips in the scribe lines. The scribe-line device may connect to contact pads of the integrated circuits using probe cards, and its ability to measure transistors within the integrated circuits is limited by the availability of contact pads of the integrated circuits and the availability of the contact pads to characterize the various transistor types used in the semiconductor chip. Moreover, the resolution of the test results obtained by the scribe-line device is that of the reticle, i.e. typically nine dies. The scribe-line device is unable to obtain information on die-to-die variability. Integrated circuits increasingly include embedded memories and it is challenging to efficiently test the embedded memory of each chip using existing testing devices present in the scribe-line. As such, there is a need for a new method of testing the embedded memory in the semiconductor chip.

SUMMARY

According to various embodiments, there may be provided a semiconductor chip. The semiconductor chip may include a memory, a power supply line, a noise generator and a switch. The power supply line may include a first power supply line portion and a second power supply line portion. The power supply line may be configured to provide a power supply signal through each of the first power supply line portion and the second power supply line portion. The noise generator may be connected to the second power supply line portion. The noise generator may be configured to receive the power supply signal from the second power supply line portion and output a noisy power supply signal based on the power supply signal. The switch may be coupled to the memory, the first power supply line portion, and the noise generator. The switch may be configured to selectively electrically connect the memory to one of the first power supply line portion and the noise generator.

According to various embodiments, there may be provided a method of fabricating a semiconductor chip. The method may include providing a memory. The method may further include providing a power supply line that includes a first power supply line portion and a second power supply line portion. The power supply line may be configured to provide a power supply signal through each of the first power supply portion and the second power supply line portion. The method may further include providing a noise generator connected to the second power supply line portion. The noise generator may be configured to: receive the power supply signal from the second power supply line portion; and output a noisy power supply signal based on the power supply signal. The method may further include providing a switch coupled to the memory, the first power supply line portion, and the noise generator, and configuring the switch to selectively electrically connect the memory to the first power supply line portion and to the noise generator.

According to various embodiments, there may be provided a method of testing a plurality of semiconductor chips that each includes a memory. The method may include, for each semiconductor chip of the plurality of semiconductor chips: supplying a noisy power supply signal to the memory by electrically connecting the memory to an on-chip noise generator, and running a built-in-self-test on the memory. The method may further include identifying a first subset of the plurality of semiconductor chips having memories that fail the built-in-self-test when the memories are supplied with the noisy power supply signal.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

The embodiments generally relate to semiconductor chips and methods of testing the semiconductor chips. More particularly, some embodiments relate to semiconductor chips having an embedded memory, and the methods of testing involve on-chip monitoring of the pass gate threshold voltage of the embedded memory.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"(and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

According to various embodiments, a method for on-chip monitoring of the pass gate threshold voltage shift in embedded memories may be provided. The method may include supplying a noisy power supply signal to the embedded memory and running a test on the memory. The test may be a built-in-self-test (BIST). The noisy power supply signal may be provided by a noise generator that is coupled to the power supply for the memory. The method may indirectly monitor the pass gate threshold voltage shift, by comparing the embedded memories that fail when different levels of noise are introduced into the power supply. When the test is applied to all the dies on a semiconductor wafer, the die-to-die variability may be determined, and the weakest memory cell may be identified through testing.

According to various embodiments, a semiconductor chip having an on-chip noise generator may be provided, so that the method described above may be performed without involving any external equipment, i.e. to achieve on-chip monitoring. A switch on the semiconductor chip may be used to selectively connect the embedded memory to a clean power supply source, or to a noisy power supply source, i.e. to the noise generator.

Figure 1:
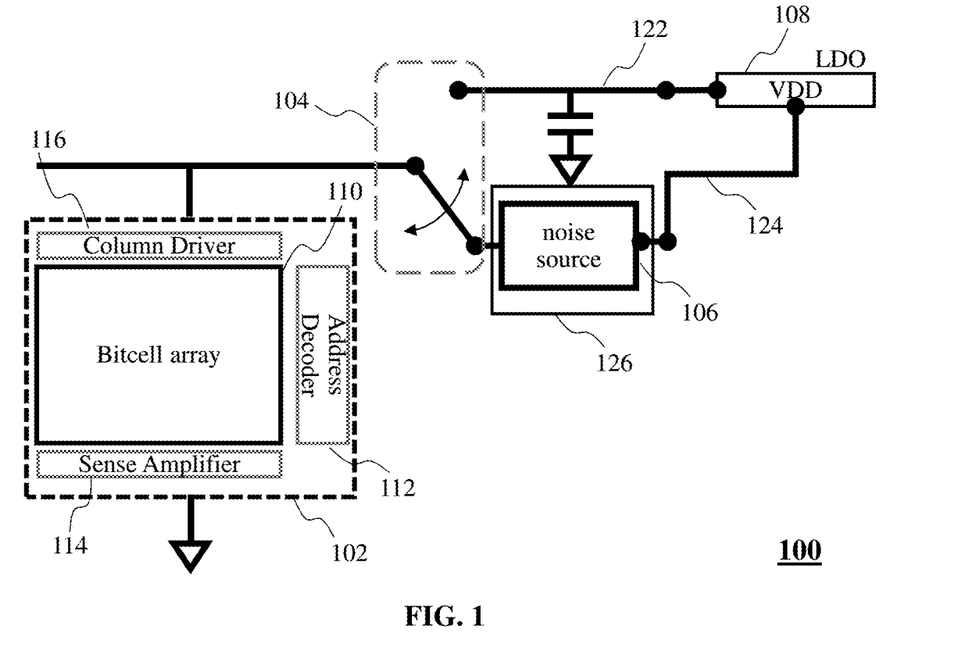
FIG. 1 shows a simplified partial circuit diagram of a semiconductor chip according to various embodiments.

FIG. 1 shows a simplified partial circuit diagram of a semiconductor chip 100 according to various embodiments. The semiconductor chip 100 may include a memory 102, a noise generator 126, a switch 104, and a power supply line 108. The power supply line 108 may include a first power supply line portion 122 and a second power supply line portion 124. The power supply line 108 may be configured to provide a power supply signal to each of the first power supply line portion 122 and the second power supply line portion 124. The noise generator 126 may be connected to the second power supply line portion 124. The noise generator 126 may be configured to receive the power supply signal from the second power supply line portion 124, and may be further configured to output a noisy power supply signal based on the received power supply signal. The noise generator 126 may include a noise source 106 that provides a noise signal. The noise generator 126 may combine the power supply signal with the noise signal, for example, by addition, to provide the noisy power supply signal. The noise generator 126 may be external to the memory 102. The noisy power supply signal may include random white noise. The switch 104 may be coupled to each of the memory, the first power supply line portion 122 and the noise generator 126. The switch 104 may be configured to selectively operate the semiconductor chip 100 in one of an operational mode and a diagnostic mode. When the semiconductor chip 100 is operating in the operational mode, the switch 104 may electrically connect the memory 102 to the first power supply line portion 122. When the semiconductor chip 100 is operating in the diagnostic mode, the switch 104 may electrically connect the memory 102 to the noise generator 126. In other words, the switch 104 may be configured to selectively electrically connect the memory 102 to one of the first power supply line portion 122 and the noise generator 126. Under the operational mode, the memory 102 may be powered by the power supply signal from the first power supply line portion 122. Under the diagnostic mode, the memory 102 may be powered by the noisy power supply signal from the noise generator 126. The memory 102 may perform differently under the diagnostic mode as compared to under the operational mode, as a result of the noise that is introduced into its power supply. The difference in performance, when considered together with the noise level in the power supply, may provide information on the pass gate threshold voltage of the memory 102.

According to various embodiments, the memory 102 may include a bitcell array 110, column drivers 116, sense amplifiers 114 and an address decoder 112. The column driver may be configured to read from, and write to, the bitcell array 110. The bitcell array 110 may include a plurality of bitcells arranged in rows and columns. Each bitcell of the bitcell array 110 may be configured to store one bit worth of data. The sense amplifier 114 may be configured to amplify low power signals read from a bitcell. The address decoder 112 may be configured to decode bitcell rows from a specified memory address. The memory 102 may include wordlines that run along the rows, and bitlines that run along the columns. Each bitcell column may be connected to a pair of bitlines. In other words, all the bitcells within a column of the bitcell array 110 may be connected to the pair of bitlines of the same column. Each pair of bitlines of a column may be coupled to a respective sense amplifier 114. During a read operation of the memory 102, the address decoder 112 may decode an address. The wordline identified by the address may turn on, thereby activating all the bitcells in the corresponding row. The bitline identified by the address may transmit a low power signal representing the stored value in the bitcell, to the sense amplifier 114 which then amplifies the lower power signal. The memory 102 may be for example, a static random-access memory (SRAM), a dynamic random-access memory (DRAM), a Magnetoresistive random-access memory (MRAM) or a flash memory. The bitcell will be described in more detail with respect to FIG. 8.

According to various embodiments, the power supply line 108 may include a low drop out (LDO) regulator. The LDO may be connected to the first power supply line portion 122. The LDO may include a decoupling capacitor. The LDO regulator may be used to output a low, stable voltage VDD from a main supply or battery. The output voltage of the LDO regulator may be stable, i.e. low in variability of its line and load, and may be immune to changes in ambient temperature. In other words, the LDO regulator may filter out noise or irregularities, in a voltage supply, to generate a constant and stable output voltage. Consequently, the power supply signal provided by the power supply line 108 may be a clean and stable signal.

According to various embodiments, the semiconductor chip 100 may further include a logic circuit (not shown in the figures). The memory 102 may be an embedded memory that is connected to the logic circuit. The logic circuit may generate data for storing in the memory 102. The logic circuit may retrieve stored data from the memory 102.

According to various embodiments, the semiconductor chip 100 may further include a controller (not shown in the figures). The controller may be configured to run a built-in-self-test (BIST) on the memory 102. The controller may apply test patterns on the memory 102, to check for memory faults. In the diagnostic mode of operation, the controller may run the BIST while the switch 104 electrically connects the memory 102 to the noise generator 126. In other words, in the diagnostic mode, the test controller may check the memory 102 for memory faults while the memory 102 is powered by a noisy power supply signal.

According to various embodiments, the switch 104 may include a transmission gate. The switch 104 may include a pMOS transistor and a nMOS transistor. The switch 104 may be configured to selectively electrically connect a word line of the memory to one of the first power supply line portion 122 and the noise generator 126.

Figure 2:
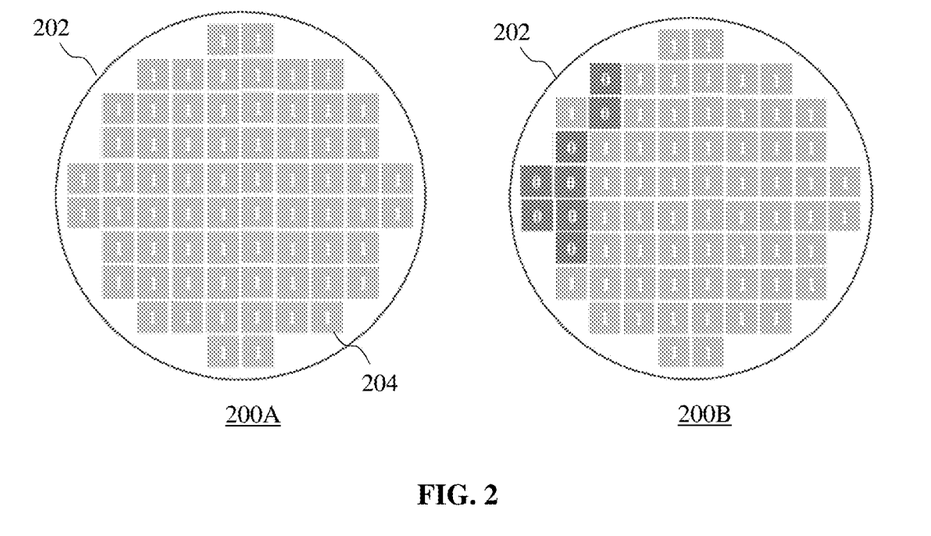
FIG. 2 shows examples of test results obtained in a method of testing a plurality of semiconductor chips, according to various embodiments.

FIG. 2 shows examples of test results obtained in a method of testing a plurality of semiconductor chips 100, according to various embodiments. The method may include testing a semiconductor wafer 202 that includes a plurality of dies 204. Each die 204 may include the semiconductor chip 100. The method of testing the plurality of semiconductor chips 100 may include running a BIST on the memory 102 of each semiconductor chip 100 of the semiconductor wafer 202, when the switch 104 electrically connects the memory 102 to the first power supply line portion 122. The diagram 200A shows an example of the BIST results for the semiconductor chips 100 of the semiconductor wafer 202, in the operational mode. The semiconductor chips 100 having memories 102 that passed the BIST are marked as "1", in the diagram 200A. In this example, all of the semiconductor chips 100 pass the BIST.

The method of testing the plurality of semiconductor chips 100 may further include running the BIST on the memory 102 of each semiconductor chip 100, when the switch 104 electrically connects the memory 102 to the noise generator 126. In other words, each memory 102 may be supplied with a noisy power supply signal. The diagram 200B shows an example of the BIST results of the semiconductor chips 100 of the semiconductor wafer 202, in the diagnostic mode. The semiconductor chips 100 having memories 102 that failed the BIST are marked as "0", in the diagram 200B. In this example, some of the semiconductor chips 100 fail the BIST. The method may include identifying a first subset of the plurality of semiconductor chips 100 that fail the BIST in the diagnostic mode. The method may include comparing the first subset to the subset of semiconductor chips 100 that fail the BIST in the operational mode. By comparing the results of the BIST in the operational mode and in the diagnostic mode, the method may determine the die-to-die variability of the semiconductor wafer 202.

The semiconductor chips 100 that fail in at least one of the modes, may have memories 102 that have inherent differences from memories 102 on other semiconductor chips 100, on the same semiconductor wafer 202. The difference may include a difference in the pass gate (PG) minimum threshold voltage, $V_{THmin}$ at the pass gate of the memory 102, required to turn on the memory 102. The relationship between the PG $V_{THmin}$ and noise in the power supply signal will be discussed with respect to FIG. 5.

Figure 3:
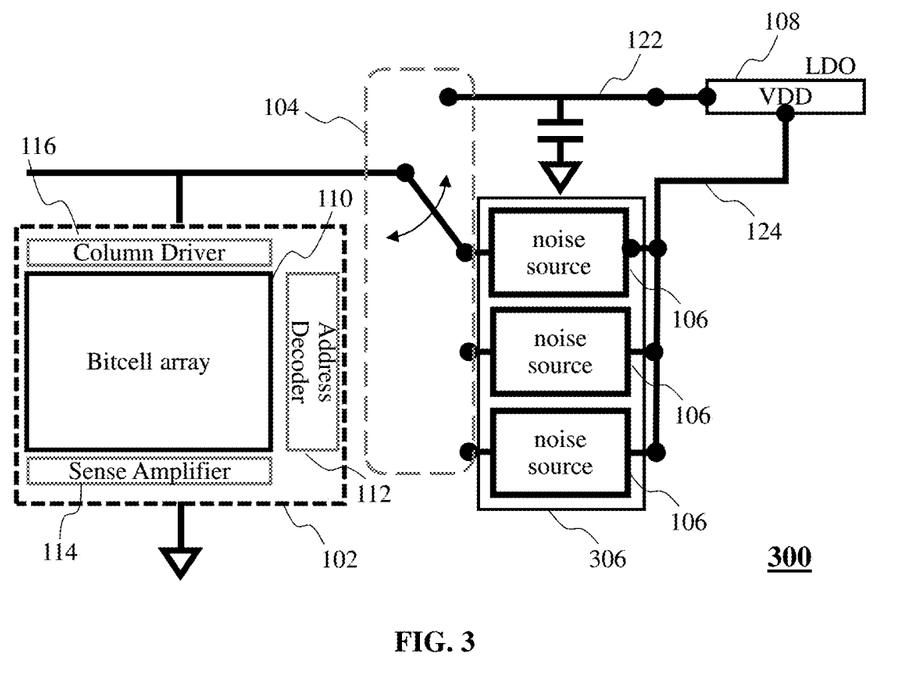
FIG. 3 shows a simplified partial circuit diagram of a semiconductor chip according to various embodiments.

FIG. 3 shows a simplified partial circuit diagram of a semiconductor chip 300 according to various embodiments. Like the semiconductor chip 100, the semiconductor chip 300 may include a memory 102, a switch 104, and a power supply line 108 that includes a first power supply line portion 122 and a second power supply line portion 124. The semiconductor chip 300 may further include a programmable noise generator 306. The programmable noise generator 306 may be connected to the second power supply line portion 124. The programmable noise generator 306 may receive the power supply signal from the second power supply line portion 124, and may introduce noise into the power supply signal. In other words, the programmable noise generator 306 may be configured to receive the power supply signal from the second power supply line portion 124, and may be further configured to output a noisy power supply signal based on the received power supply signal. The programmable noise generator 306 may be configured to selectively amplify, or vary an amplitude of, the noise in the noisy power supply signal. The programmable noise generator 306 may include an amplifier. The amplifier may be controllable to selectively amplify noise in the noisy power supply signal. The amplifier may be a cascode amplifier.

In various embodiments, the programmable noise generator 306 may include a plurality of noise sources 106. Each noise source may be configured to provide noise that has a different amplitude. The switch 104 may be configured to selectively connect the memory array 102 to the first power supply line portion 122, or to any one of the plurality of noise sources 106.

Figure 4:
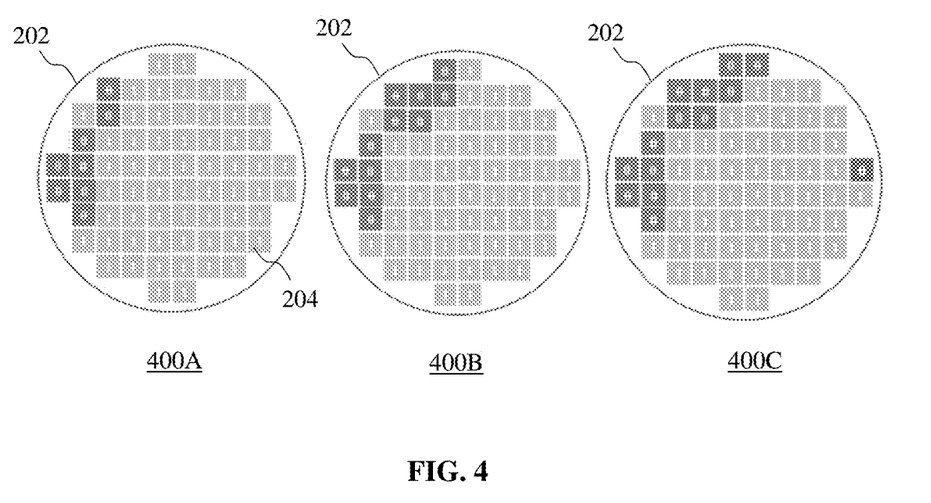
FIG. 4 shows examples of test results obtained in a method of testing a plurality of semiconductor chips, according to various embodiments.

FIG. 4 shows examples of test results obtained in a method of testing a plurality of semiconductor chips 300, according to various embodiments. The semiconductor chips 300 may be provided on a semiconductor wafer 202. The semiconductor wafer 202 may include a plurality of dies 204, and each die 204 may include the semiconductor chip 300. The method of testing the plurality of semiconductor chips 300 may include running a BIST on the memory 102 of each semiconductor chip 100, when the switch 104 electrically connects the memory 102 to the programmable noise generator 306. The method may include varying the noise level in the power supply signal provided to the memory 102, and identifying subsets of the plurality of semiconductor chips 300 that fail the BIST as the noise level changes.

The diagram 400A shows an example of the BIST results for the semiconductor chips 300 of the semiconductor wafer 202, under the diagnostic mode when the programmable noise generator 306 outputs a noisy power supply signal having noise of a first amplitude. Referring to the diagram 400A, the semiconductor chips 300 having memories 102 that passed the BIST are marked as "1", while the semiconductor chips 300 having memories 102 that failed the BIST are marked as "0". The method may include identifying a first subset of the plurality semiconductor chips 300 that fail the BIST.

The diagram 400B shows an example of the BIST results for the semiconductor chips 300 of the semiconductor wafer 202, under the diagnostic mode when the programmable noise generator 306 outputs a noisy power supply signal having noise of a second amplitude. The second amplitude may be higher than the first amplitude. The method may include identifying a second subset of the plurality semiconductor chips 300 that fail the BIST.

The diagram 400C shows an example of the BIST results for the semiconductor chips 300 of the semiconductor wafer 202, under the diagnostic mode when the programmable noise generator 306 outputs a noisy power supply signal having noise of a third amplitude. The third amplitude may be higher than the second amplitude. The method may include identifying a third subset of the plurality semiconductor chips 300 that fail the BIST. The quantity of semiconductor chips 300 that fail the BIST may increase as the noise amplitude increases. The first subset, second subset and third subset may be compared to determine non-overlapping semiconductor chips 100 between the subsets. The non-overlapping semiconductor chips 100 between the subsets may have memories 102 of different pass gate threshold voltages.

According to various embodiments, the method of testing the semiconductor chips may be scaled down for testing a single semiconductor chip. The method may identify weak bitcells in the memory of the semiconductor chip, by running BIST tests for different noisy power supply signals. The method may include iteratively applying a noisy power supply signal followed by running a BIST on the memory after each noisy power supply signal is applied. The method may include changing the amplitude of the noise in the noisy power supply signal after each iteration. For example, the method may include applying a first noisy power supply signal having a first noise amplitude and running a first BIST on the memory, applying a second noisy power supply signal having a second noise amplitude and running a second BIST on the memory. The method may include identifying the subsets of bitcells in the memory that fail each BIST and comparing the subsets, to determine bitcells that have different pass gate threshold voltages.

Figure 5:
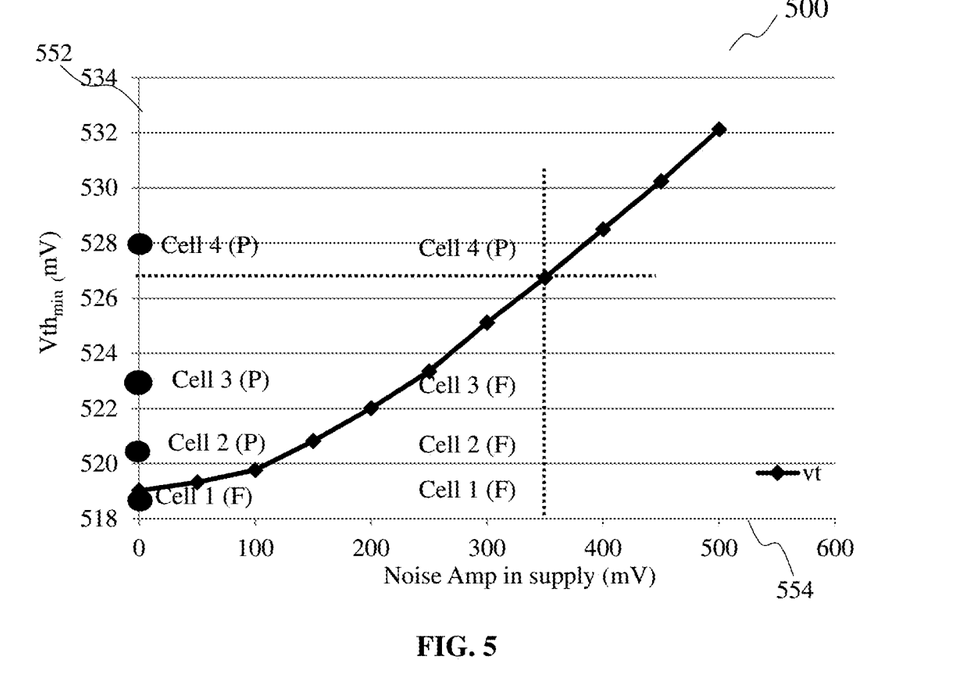
FIG. 5 shows a graph that demonstrates how the minimum pass gate (PG) threshold voltage required for turning on the memory changes with an increase in the amplitude of noise in the power supply signal.

FIG. 5 shows a graph 500 that demonstrates how the minimum pass gate (PG) threshold voltage required for turning on the memory 102 changes with an increase in the amplitude of noise in the power supply signal. The graph 500 includes a horizontal axis 550 indicating noise amplitude measured in millivolts, and a vertical axis 552 indicating minimum threshold voltage $V_{THmin}$ measured in millivolts. As shown in the graph 500, $V_{THmin}$ increases as the noise amplitude increases.

As an example, a first memory 102 may have a PG threshold voltage of 518 mV, a second memory 102 may have a PG threshold voltage of 520 mV, a third memory 102 may have a PG threshold voltage of 522 mV, and a fourth memory 102 may have a PG threshold voltage of 528 mV. When the noise amplitude is zero, the PG $V_{THmin}$ may be 519 mV. Accordingly, the first memory 102 may fail to operate, while the second, third and fourth memories 102 may pass the BIST. When the noise amplitude is increased to 350 mV, the PG $V_{THmin}$ may increase to 527 mV. Accordingly, at this noise amplitude, only the fourth memory 102 may pass the BIST while the other three memories 102 may fail to operate. As such, by comparing which memories 102 pass and fail the BIST as the noise amplitudes are changed, it can be determined which memories 102 have a different PG threshold voltage. In other words, by identifying that the second and third memories 102 pass the BIST when the noise amplitude is at 0 and that they fail the BIST when the noise amplitude is increased to 350 mV, it may be determined that the threshold voltage of the second and third memories 102 may be different from that of the fourth memory.

Figure 6:
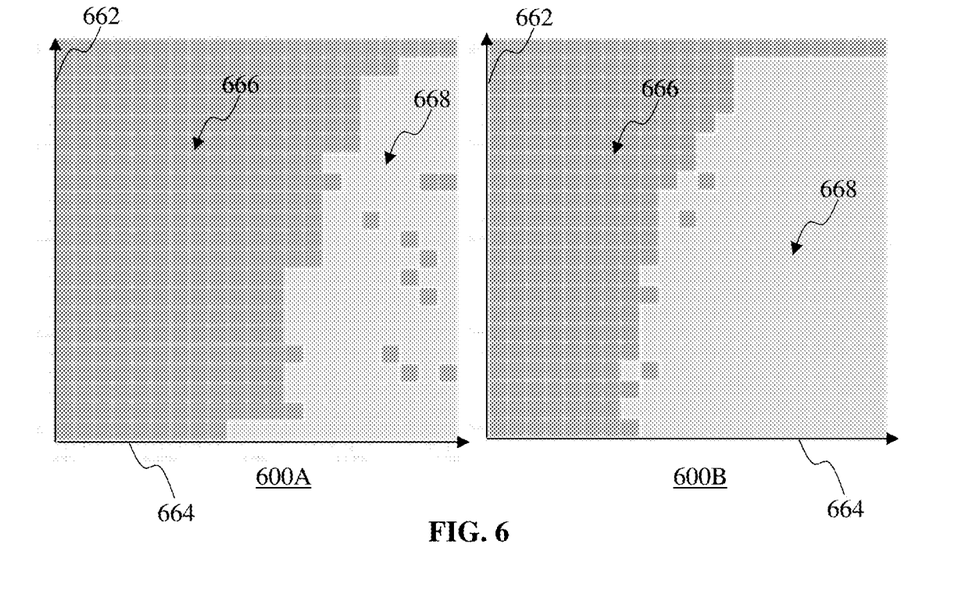
FIGS. 6 and 7 show the test results of an experiment conducted to validate a method of testing a plurality of semiconductor chips according to various embodiments.
Figure 7:
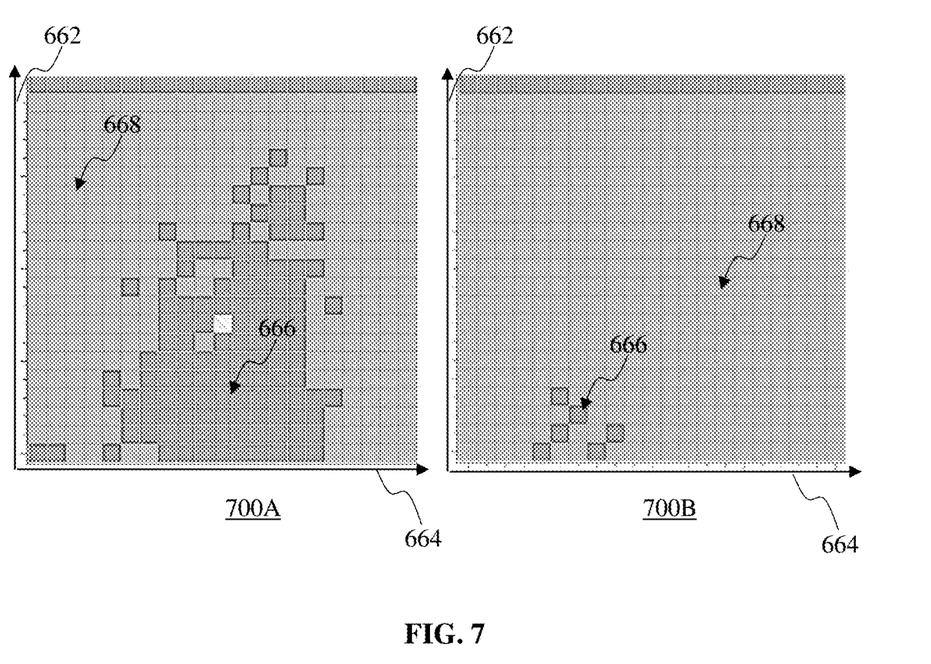

An experiment was conducted to validate the method of testing a plurality of semiconductor chips according to various embodiments. FIGS. 6 and 7 show the die-level test results for two different dies. Each test includes providing a plurality of different power supply voltages to the semiconductor chip and conducting a BIST for every power supply voltage. The test results show the effect of power supply noise on the BIST outcome.

Referring to FIG. 6, each of the diagrams 600A and 600B include a vertical axis 662 and a horizontal axis 664. The vertical axis 662 indicates period time associated with the BIST in nanoseconds, while the horizontal axis 664 indicates power supply voltage in milivolts. The diagram 600A shows the BIST test result conducted on a first die, when its on-chip memory 102 is operated in the diagnostic mode and supplied with a noisy power supply signal. The on-chip memory 102 may be supplied with the noisy power supply signal when it is connected to the on-chip noise generator.

The diagram 600B shows the BIST test result conducted on the first die, when its on-chip memory 102 is operated in the operational mode and supplied with a clean power supply signal, i.e. suppressed noise. The on-chip memory 102 may be supplied with the clean power supply signal when it is connected to the first power supply line 122. The dark segments 666 represent failure of the BIST while the light segments 668 represent passing of the BIST. By comparing the diagram 600A to the diagram 600B, it can be seen that when the memory 102 is supplied with a noisy power supply signal, the power supply voltage needs to be higher, in order for the memory 102 to pass the BIST.

Referring to FIG. 7, each of the diagrams 700A and 700B include the vertical axis 662 and the horizontal axis 664. The diagram 700A shows the BIST test result conducted on a second die, when its on-chip memory 102 is operated in the diagnostic mode and supplied with a noisy power supply signal from the on-chip noise generator. The diagram 700B shows the BIST test result conducted on the second die, when its on-chip memory 102 is operated in the operational mode and supplied with a clean power supply signal from the first power supply line 122. The dark segments 666 represent failure of the BIST while the light segments 668 represent passing of the BIST. By comparing the diagram 700A to 700B, it can be seen that when the memory 102 is supplied with a noisy power supply signal, the memory 102 fails the BIST for a large range of power supply voltage. The test results show that both the first die and the second die have marginal weakness in their pass gate threshold voltage, which could not be determined under the operational mode where the power supply signal is clean from noise.

Figure 8:
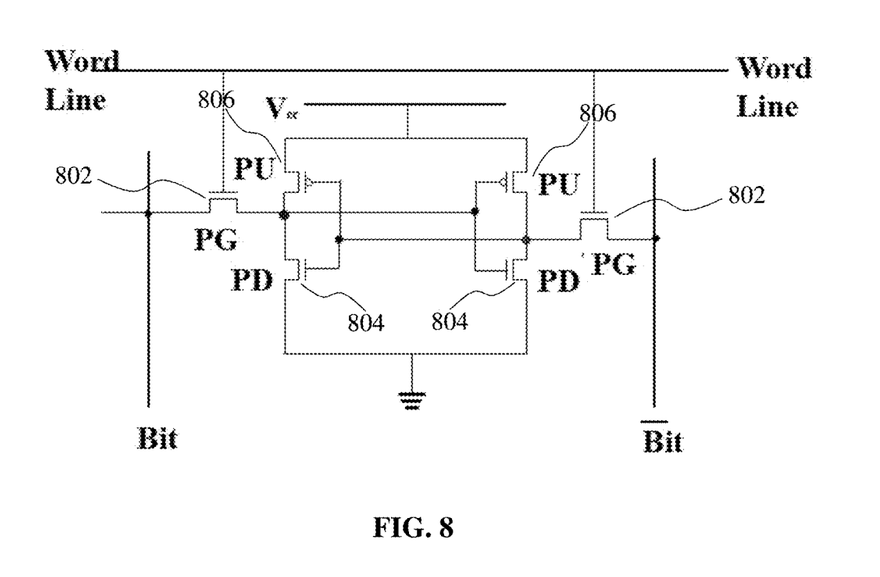
FIG. 8 shows a circuit diagram of a SRAM bitcell.

FIG. 8 shows a circuit diagram of a SRAM bitcell. The SRAM bitcell may include six transistors, including two pass gates (PG) 802, two pull-up transistors (PU) 806 and two pull-down (PD) transistors 804. The transistors may be arranged to form a cross-coupled inverter. The gate terminals of the pass gates 802 may be coupled to the wordline 808 of the memory 102. The drain or source terminals of the pass gates 802 may be coupled to the bitlines. The pull up 806 may be coupled to the power supply.

Figure 9A:
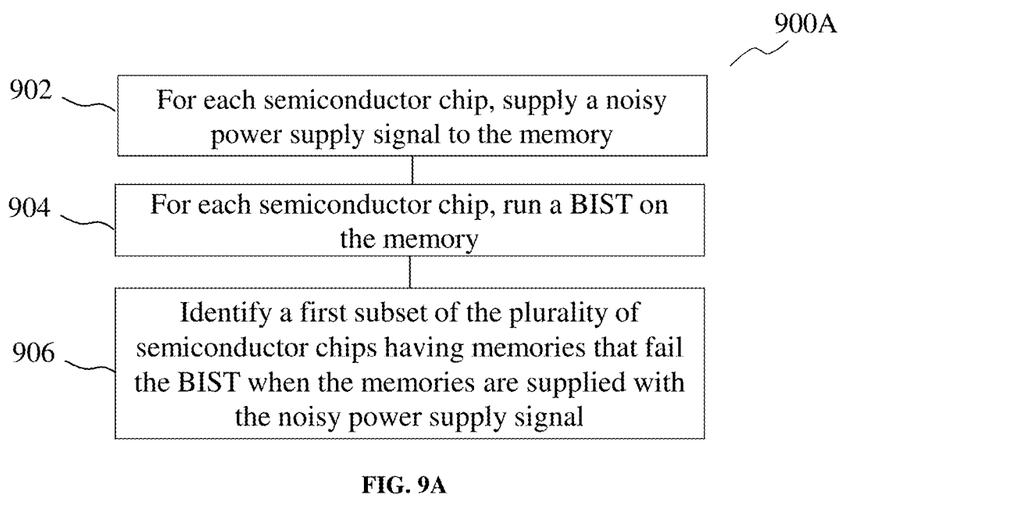
FIG. 9A shows a flow diagram of a method of testing a plurality of semiconductor chips according to various embodiments.

FIG. 9A shows a flow diagram of a method 900A, of testing a plurality of semiconductor chips according to various embodiments. Each semiconductor chip may include a memory. The method 900A may include supplying a noisy power supply signal to the memory by electrically connecting the memory to an on-chip noise generator, for each semiconductor chip of the plurality of semiconductor chips, in 902. The method 900A may further include running a built-in-self-test on the memory, for each semiconductor chip of the plurality of semiconductor chips, in 904. The method 900A may further include identifying a first subset of the plurality of semiconductor chips having memories that fail the built-in-self-test when the memories are supplied with the noisy power supply signal, in 906. The semiconductor chips may be the semiconductor chips 100 or 300. The method 900A may be applied to a semiconductor wafer that includes a plurality of dies, and each die may include a respective semiconductor chip. The on-chip noise generator may include the noise generator 126 or the programmable noise generator 306.

According to various embodiments, the method 900A may further include generating a further noisy power supply signal to the memory of each semiconductor chip, by electrically connecting the memory to the on-chip noise generator. An amplitude of noise in the further noisy power supply signal may be higher than an amplitude of noise in the noisy power supply signal. The method 900A may further include running the BIST on the memory of each semiconductor chip, and identifying a second subset of the plurality of semiconductor chips that fail the built-in-self-test when the memories are supplied with the further noisy power supply signal. The method 900A may further include comparing the first subset to the second subset, to identify semiconductor chips having memories of different pass gate threshold voltages.

Figure 9B:
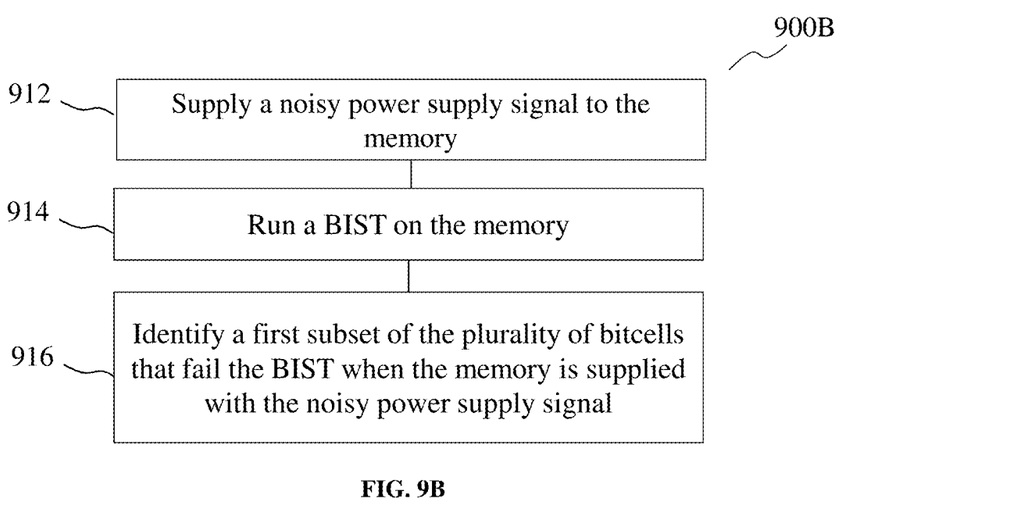
FIG. 9B shows a flow diagram of a method of testing a semiconductor chip according to various embodiments.

FIG. 9B shows a flow diagram of a method 900B of testing a semiconductor chip, according to various embodiments. The method 900B may be similar to the method 900A, but may be scaled down to test a single semiconductor chip, instead of a plurality of semiconductor chips. The method 900B may identify failure in bitcells within the tested semiconductor chip. The method 900B may include supplying a noisy power supply signal to the memory of the semiconductor chip by electrically connecting the memory to an on-chip noise generator, in 912. The method 900B may further include running a built-in-self-test on the memory, in 914. The method 900B may further include identifying a first subset of the plurality of bitcells that fail the built-in-self-test when the memory is supplied with the noisy power supply signal, in 916. The semiconductor chip may be the semiconductor chip 100 or 300. The memory may be the memory 102 that includes a bitcell array 110 that includes a plurality of bitcells.

According to various embodiments, the method 900B may further include generating a further noisy power supply signal to the memory of the semiconductor chip, by electrically connecting the memory to the on-chip noise generator. An amplitude of noise in the further noisy power supply signal may be higher than an amplitude of noise in the noisy power supply signal. The method 900B may further include running the BIST on the memory of the semiconductor chip, and identifying a second subset of the plurality of bitcells that fail the built-in-self-test when the memory is supplied with the further noisy power supply signal. The method 900B may further include comparing the first subset to the second subset, to identify bitcells of different pass gate threshold voltages.

Figure 10:
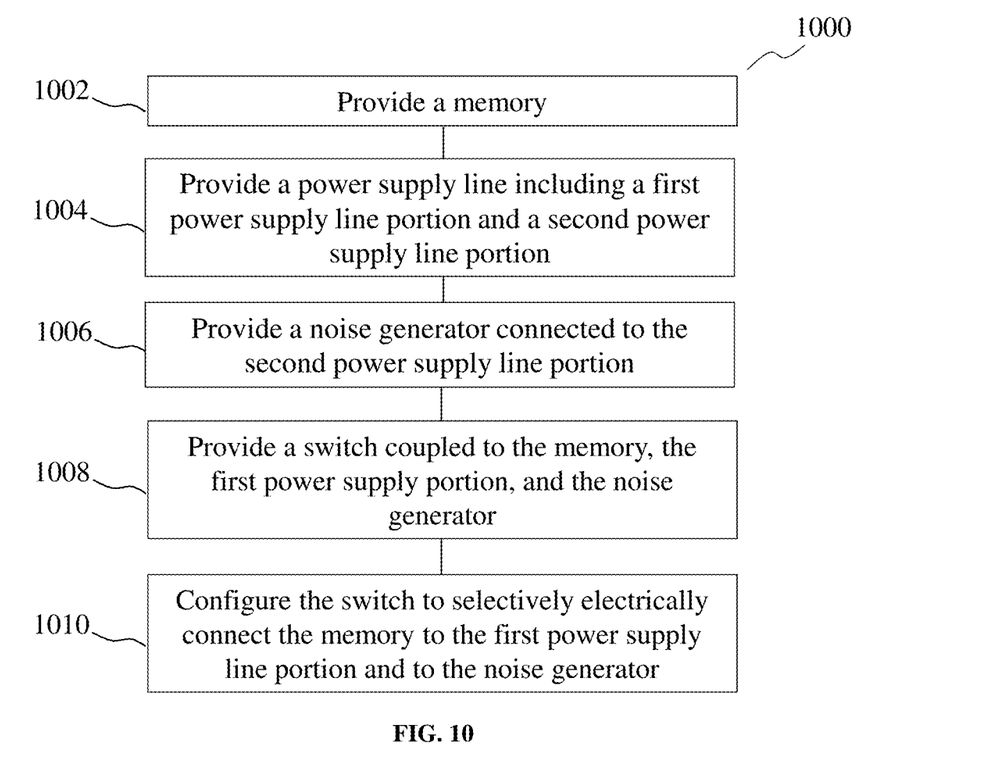
FIG. 10 shows a flow diagram of a method of fabricating a semiconductor chip according to various embodiments.

FIG. 10 shows a flow diagram of a method of fabricating a semiconductor chip 1000 according to various embodiments. The method 1000 may include providing a memory, in 1002. The method 1000 may further include providing a power supply line including a first power supply line portion and a second power supply line portion, in 1004. The power supply line may be configured to provide a power supply signal through each of the first power supply portion and the second power supply line portion. The method 1000 may further include providing a noise generator connected to the second power supply line portion, in 1006. The noise generator may be configured to receive the power supply signal from the second power supply line portion, and to output a noisy power supply signal based on the power supply signal. The method 1000 may further include providing a switch coupled to the memory, the first power supply line portion, and the noise generator, in 1008. The method 1000 may further include configuring the switch to selectively electrically connect the memory to the first power supply line portion and to the noise generator, in 1010.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor chip comprising:
   a memory;
   a power supply line including a first power supply line portion and a second power supply line portion, the power supply line configured to provide a power supply signal through each of the first power supply line portion and the second power supply line portion;

a noise generator connected to the second power supply line portion, and configured to:
   receive the power supply signal from the second power supply line portion; and
   output a noisy power supply signal based on the power supply signal; and a switch coupled to the memory, the first power supply line portion, and the noise generator, wherein the switch is configured to selectively electrically connect the memory to one of the first power supply line portion and the noise generator.

2. The semiconductor chip of claim 1, wherein the switch is configured to selectively electrically connect a word line of the memory to one of the first power supply line portion and the noise generator.

3. The semiconductor chip of claim 1, further comprising:
a decoupling capacitor connected to the first power supply line portion.

4. The semiconductor chip of claim 1, wherein the noise generator is configured to selectively amplify noise in the noisy power supply signal.

5. The semiconductor chip of claim 4, wherein the noise generator comprises a cascode amplifier configured to selectively amplify noise in the noisy power supply signal.

6. The semiconductor chip of claim 1, wherein the noise generator comprises a plurality of noise sources, each noise source configured to provide noise having a different amplitude, wherein the switch is configured to selectively electrically connect the memory to one of the first power supply line portion and any one of the plurality of noise sources.

7. The semiconductor chip of claim 1, wherein the noise generator is configured to output the noisy power supply signal by generating a noise signal and adding the noise signal to the power supply signal.

8. The semiconductor chip of claim 1, wherein the power supply line comprises a low drop out regulator.

9. The semiconductor chip of claim 1, wherein when the semiconductor chip is in an operational mode, the switch electrically connects the memory to the first power supply line portion.

10. The semiconductor chip of claim 1, further comprising:
a controller configured to run a built-in-self-test on the memory.

11. The semiconductor chip of claim 1, wherein the switch comprises a transmission gate.

12. The semiconductor chip of claim 1, further comprising:
a logic circuit, wherein the memory is an embedded memory connected to the logic circuit.

13. A method of fabricating a semiconductor chip, the method comprising:
providing a memory;
providing a power supply line including a first power supply line portion and a second power supply line portion, the power supply line configured to provide a power supply signal through each of the first power supply portion and the second power supply line portion;
providing a noise generator connected to the second power supply line portion, wherein the noise generator is configured to:
   receive the power supply signal from the second power supply line portion; and
   output a noisy power supply signal based on the power supply signal;
providing a switch coupled to the memory, the first power supply line portion, and the noise generator; and
configuring the switch to selectively electrically connect the memory to the first power supply line portion and to the noise generator.

14. The method of claim 13, further comprising:
providing a decoupling capacitor connected to the first power supply line portion.

15. The method of claim 13, further comprising:
providing an amplifier in the noise generator, wherein the amplifier is controllable to selectively amplify noise in the noisy power supply signal.

16. The method of claim 13, further comprising:
providing a low drop out regulator in the power supply line.

17. The method of claim 13, further comprising:
providing a controller configured to run a built-in-self-test on the memory.

18. A method of testing a semiconductor chip, wherein the semiconductor chip comprises a memory comprising a plurality of bitcells, the method comprising:
supplying a noisy power supply signal to the memory by electrically connecting the memory to an on-chip noise generator;
running a built-in-self-test on the memory; and
identifying a first subset of the plurality of bitcells that fail the built-in-self-test when the memory is supplied with the noisy power supply signal.

19. The method of claim 18, further comprising:
supplying a further noisy power supply signal to the memory by electrically connecting the memory to the on-chip noise generator, wherein an amplitude of noise in the further noisy power supply signal is higher than an amplitude of noise signal in the noisy power supply signal; and
running the built-in-self-test on the memory; and
identifying a second subset of the plurality of bitcells that fail the built-in-self-test when the memory is supplied with the further noisy power supply signal.

20. The method of claim 19, further comprising:
comparing the first subset to the second subset, to identify bitcells of different pass gate threshold voltages.

* * * * *